(12) United States Patent
Chiu et al.

(10) Patent No.: US 7,529,088 B2
(45) Date of Patent: May 5, 2009

(54) HEAT DISSIPATION MODULE AND FLOW DIRECTION CONTROLLING STRUCTURE THEREOF

(75) Inventors: Yung-Yu Chiu, Taoyuan Hsien (TW); Wen-Shi Huang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 25 days.

(21) Appl. No.: 11/246,086

(22) Filed: Oct. 11, 2005

(65) Prior Publication Data

US 2006/0081367 A1 Apr. 20, 2006

(30) Foreign Application Priority Data

Oct. 15, 2004 (TW) ............................... 93131272 A

(51) Int. Cl.
*H05K 7/20* (2006.01)
*F04D 29/44* (2006.01)
*F24F 7/06* (2006.01)

(52) U.S. Cl. .................... 361/695; 415/146; 415/211.2; 454/347; 361/694

(58) Field of Classification Search ............. 415/211.2, 415/146; 361/695, 694; 165/80.3, 104.33; 416/247 R; 454/347
See application file for complete search history.

(56) References Cited

U.S. PATENT DOCUMENTS

| | | | |
|---|---|---|---|
| 4,648,007 A * | 3/1987 | Garner | 361/695 |
| 6,042,348 A | 3/2000 | Aakalu et al. | |
| 6,108,203 A * | 8/2000 | Dittus et al. | 361/695 |
| 6,181,557 B1 * | 1/2001 | Gatti | 361/695 |
| 6,445,581 B1 * | 9/2002 | Carbonneau et al. | 361/687 |
| 6,936,767 B2 * | 8/2005 | Kleinecke et al. | 174/50 |

(Continued)

FOREIGN PATENT DOCUMENTS

CN 1466413 1/2004

(Continued)

OTHER PUBLICATIONS

Wenzel, Dual FAn N+1 Enclosure, Feb. 1993, IBM TechnicalDisclosure Bulletin, vol. 36, No. 02, pp. 315-316.*

(Continued)

*Primary Examiner*—Gregory D Thompson
(74) *Attorney, Agent, or Firm*—Birch, Stewart, Kolasch & Birch, LLP

(57) ABSTRACT

A heat dissipation module includes a first heat dissipation apparatus, a second heat dissipation apparatus, and a flow direction controlling structure. The first heat dissipation apparatus and the second heat dissipation apparatus are symmetrically disposed. The flow direction controlling structure has several rotatable elements disposed between the first heat dissipation apparatus and the second heat dissipation apparatus. Each of the rotatable elements has a fixed end and a correspondingly movable end for guiding airflow. The rotatable elements can be sheet-shaped, wing-shaped, arc-shaped or nonlinear in cross section. The thickness of the rotatable elements varies or decreases from the fixed end to the movable end. The rotatable elements overlap an adjacent rotatable element so as to selectively seal the heat dissipation apparatuses. The heat dissipation module and the flow direction controlling structure control airflow, remain overall outlet scope, reduce noise and improve heat dissipation efficiency of the module.

8 Claims, 8 Drawing Sheets

U.S. PATENT DOCUMENTS 7,018,169 B2 * 3/2006 Phillip et al. .................. 415/60
7,128,526 B2 * 10/2006 Paulsen ...................... 415/146

FOREIGN PATENT DOCUMENTS

| JP | 10148352 | | | 6/1998 |
|---|---|---|---|---|
| JP | 2004112899 | A | * | 4/2004 |
| SU | 802628 | B | * | 2/1981 |
| TW | 477404 | Y | | 2/2002 |

OTHER PUBLICATIONS

English translation of Sakai (JP 2004-112899), Apr. 8, 2004.*

* cited by examiner

HEAT DISSIPATION MODULE AND FLOW DIRECTION CONTROLLING STRUCTURE THEREOF

This Non-provisional application claims priority under U.S.C. § 119 (a) on Patent Application No(s). 093131272 filed in Taiwan, Republic of China on Oct. 15, 2004, the entire contents of which are hereby incorporated by reference.

BACKGROUND

The invention relates to a heat dissipation module and a flow direction controlling structure thereof, and particularly to a heat dissipation module with a flow direction controlling structure capable of controlling air flow and preventing outside air flow entering the heat dissipation module.

As efficiency of electronic devices increases rapidly, heat dissipation apparatuses such as impellers have become essential elements thereof. Heat generated by the electronic devices, if not properly dissipated, can lead to decreased efficiency or even burnout of the electronic devices. Particularly, heat dissipation apparatuses such as impellers are critical to micro-electrical elements, such as integrated circuits (ICs). As integration increases and package technology improves, size of the ICs is reduced, and heat accumulated in the unit area thereof increases. As a result, impellers with high efficiency are a major area of development.

Generally, ventilation, convection or heat dissipation in a heat generating system such as a server, a computer, an electronic mechanism or a power supply is facilitated by a heat dissipation apparatus, such as an axial flow fan, or a centrifugal fan. The heat dissipation apparatus can guide air flow to dissipate heat generated by the electronic devices to the environment for performing heat dissipation or air convection.

FIG. 1A illustrates a conventional parallel fan module. The conventional parallel fan module 10 includes a first blower 110 and a second blower 120 for discharging air inside the first blower 110 and the second blower 120 to be respectively vented through the outlet 111 and the outlet 121.

When the first blower 110 and the second blower 120 are in operation, the first blower 110 and the second blower 120 discharge the air through the outlet 111 and the outlet 121, respectively. However, the blowers 110 and/or 120 may has glitch or malfunction. When one of the blowers 110 and 120 malfunctions, for example, the second blower 120 malfunctions, only the first blower 110 is in operation, and the air inside the first blower 110 is still able to be discharged through the outlet 111. The outlet 121 of the second blower 120 is wide opens to the environment, which may lead to backflow and air accumulation in the second blower 120. In this case, the first blower 110 may be affected by the backflow to reduce heat dissipation efficiency of the entirety of the parallel fan module 10.

Conventionally, a compensation mechanism is provided to increase power of the blower in operation. With the compensation mechanism, power of the blower in operation is increased to compensate for the malfunctioning blower such that forced convection occurs in the second blower 120 to discharge the fluid accumulated in the first blower 110 and the second blower 120. The compensation mechanism, however, increases cost and complexity of the structure, and does not provide real-time compensation since reaction time is required to implement compensation from the time when one of the blowers is detected as malfunction. Further, backflow is not completely prevented since the outlet 121 remains open to the environment.

In another conventional solution, a plurality of flappers is provided at the outlets to prevent from the backflow. An example is shown in FIG. 1B, FIG. 1C and FIG. 1D. FIG. 1B illustrates a conventional parallel fan module with flappers, in which the blowers are not in operation. FIG. 1C illustrates the conventional parallel fan module with flappers in operation. FIG. 1D illustrates the conventional parallel fan module with flappers in which one of the blowers malfunctions. In the conventional parallel fan module 10, a flapper 112 is installed at the outlet 111 of the first blower 110, and a flapper 122 is installed at the outlet 121 of the second blower 120. When the first blower 110 and the second blower 120 are not in operation, the flappers 112 and 122 are in a closed position, as shown in FIG. 1B, by gravity or other specific design (such as a biased device) to seal the outlet 111 and the outlet 112.

When the first blower 110 and the second blower 120 are in operation, the air within the first blower 110 and the second blower 120 is respectively discharged through the outlet 111 and the outlet 121, generating a flow force to the flappers 112 and 122 such that the flappers 112 and 122 move to an open position as shown in FIG. 1C.

When one of the blowers, such as the second blower 120, malfunctions, only the first blower 110 is in operation as shown in FIG. 1D. In this case, the flapper 112 at the outlet 111 is moved to the open position by the flow force, but the flapper 122 at the outlet 121 maintains in the closed position since no flow force is generated in the second blower 120. Thus, the outlet 121 of the second blower 120 is sealed such that fluid in the environment does not backflow to the malfunctioning second blower 120, preventing hot air accumulation and reduction in heat dissipation efficiency.

The flappers, however, are respectively disposed at the blowers. When one blower in the heat dissipation module malfunctions, the outlet of the malfunctioned blower is sealed by the flapper thereof to prevent backflow. Thus, there is no heat dissipation to the heat source corresponding to the sealed outlet, which leads to heat accumulation at the heat source and reduction of heat dissipation efficiency. Also, the whole outlet area of the heat dissipation module is reduced. In the conventional parallel fan module in FIG. 1D, for example, the original whole outlet area, including the outlet 111 and the outlet 121, is reduced to be half one when the flapper 122 seals the outlet 121, which seriously deteriorates heat dissipation effect.

Further, the flappers are provided to prevent backflow only, and there is no other specific mechanism in the conventional heat dissipation module. Thus, heat dissipation highly corresponds to the outlet area in the conventional heat dissipation module. When a large-sized heat source is employed, a single heat dissipation module does not provide sufficient heat dissipation, thus leading to heat accumulation at the heat source.

SUMMARY

Accordingly, to solve the above-mentioned problem, the invention discloses a heat dissipation module and a flow direction controlling structure thereof to control airflow, remain overall outlet scope, reduce noise and improve heat dissipation efficiency of the heat dissipation module.

A flow direction controlling structure for a heat dissipation module includes a plurality of rotatable elements disposed at an outlet of the heat dissipation module. Each of the rotatable elements overlaps the adjacent rotatable element so as to selectively seal the heat dissipation module. Each of the rotatable elements has a fixed end and a correspondingly movable end for guiding airflow. Each of the rotatable elements is sheet-shaped, wing-shaped, arc-shaped or nonlinear in cross section, and varies or decreases from the fixed end to the movable end in thickness.

The heat dissipation module includes at least one heat dissipation apparatus (impeller), such as an axial flow fan or a blower. The flow direction controlling structure is modularly formed and detachably attached in one or more positions of the heat dissipation module. Each of the rotatable elements can be rotatably disposed at the outlet, or disposed on one or more positions of the impeller by axial disposal, coaxial disposal, modular disposal, direct disposal on axis, engagement or other equivalent rotative structures. Each of the rotatable elements is made of polyester films, acrylic resin, glass fiber, or any other filmy material.

Further, the heat dissipation module has a first heat dissipation apparatus or first impeller and a second heat dissipation apparatus or second impeller. The flow direction controlling structure includes a plurality of rotatable elements disposed between the first impeller and the second impeller. The rotatable elements disposed at an outlet of the first impeller and the rotatable elements disposed at an outlet of the second impeller can be symmetrical to a virtual line passing connection points between the first impeller and the second impeller. When outlet pressure of the first impeller and the second impeller are different, the movable ends of the rotatable elements can deflect to the first impeller or the second impeller to change outlet areas of the first impeller and the second impeller.

When the first impeller malfunctions, the movable ends of the rotatable elements are forced by air flow generated by the second impeller and deflect to the first impeller to seal the first impeller. When the second impeller malfunctions, the movable ends of the rotatable elements are forced by air flow generated by the first impeller and deflect to the second impeller to seal the second impeller. One of the rotatable elements acts as an isolation wall between the first impeller and the second impeller so that the first impeller and the second impeller respectively include a tunnel. The fixed end of the rotatable element acting as the isolation wall can be positioned at the virtual line.

The flow direction controlling structure further includes a limiting element. When the first impeller and the second impeller are in operation, the limiting element limits the movable ends of the rotatable elements from deflecting to neither the first impeller nor the second impeller. The limiting element includes a grille, a guiding bar, a linkage passage, an extrusion block, a frame, a blocking body, a shaft, a pin, or other equivalent elements. The flow direction controlling structure can be modularly formed and detachably attached in one or more positions between the first impeller and the second impeller.

Each of the rotatable elements can be rotatably disposed between the first impeller and the second impeller. Each of the rotatable elements can be disposed between the first impeller and the second impeller by axial disposal, coaxial disposal, modular disposal, direct disposal on axis, engagement or other equivalent rotative structures. The rotatable elements are made polyester films, acrylic resin, glass fiber, or any other filmy material. The heat dissipation module can include two parallel fans, and the first impeller and the second impeller can be axial flow fans or blowers.

According to a further object of the invention, a heat dissipation module is disclosed, which includes at least one heat dissipation apparatus, such as a first heat dissipation apparatus and a second heat dissipation apparatus, which are symmetrically disposed, and a flow direction controlling structure. The flow direction controlling structure includes a plurality of rotatable elements disposed between the first heat dissipation apparatus and the second heat dissipation apparatus. Each of the rotatable elements includes a fixed end and a correspondingly movable end for guiding airflow.

A detailed description is given in the following embodiments with reference to the accompanying drawings.

DESCRIPTION OF THE DRAWINGS

The invention can be more fully understood by reading the subsequent detailed description in conjunction with the examples and references made to the accompanying drawings, wherein.

DETAILED DESCRIPTION

Figure 1A:
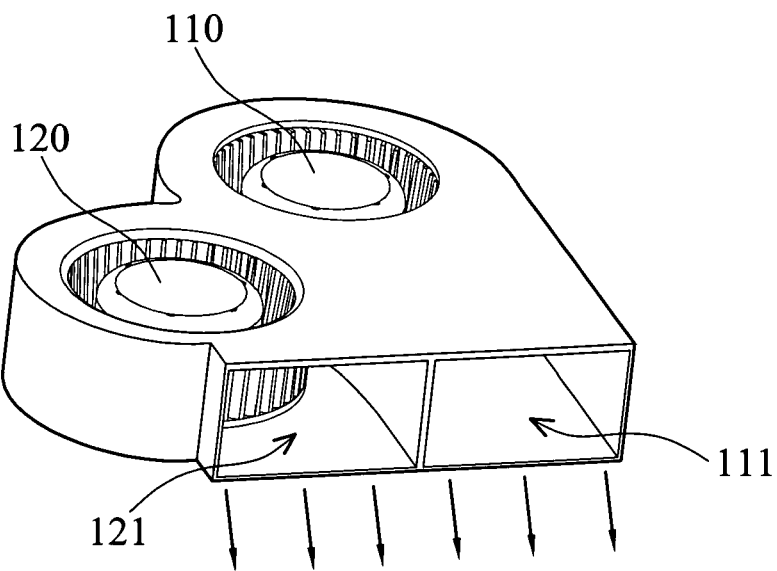
FIG. 1A is a schematic view of a conventional parallel fan module.
Figure 1B:
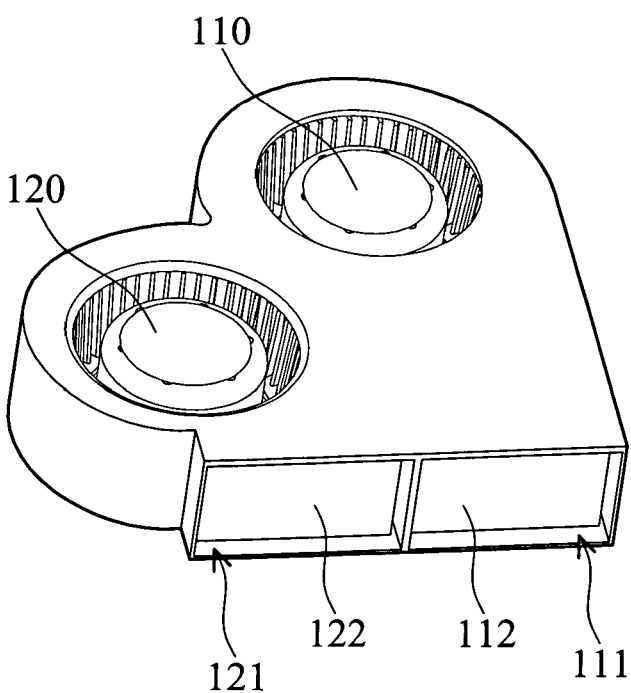
FIG. 1B is a schematic view of a conventional parallel fan module with flappers, in which two blowers are not in operation.
Figure 1C:
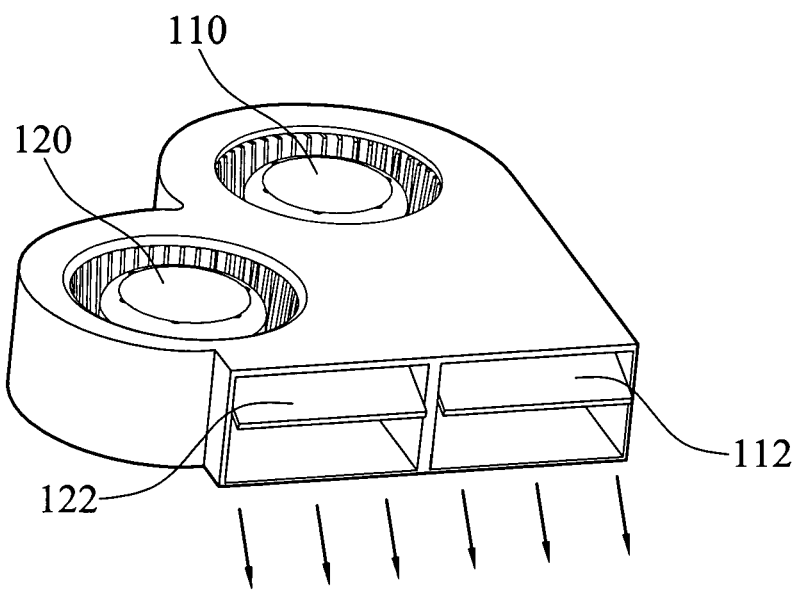
FIG. 1C is a schematic view of the conventional parallel fan module with flappers, in which two blowers are in operation.
Figure 1D:
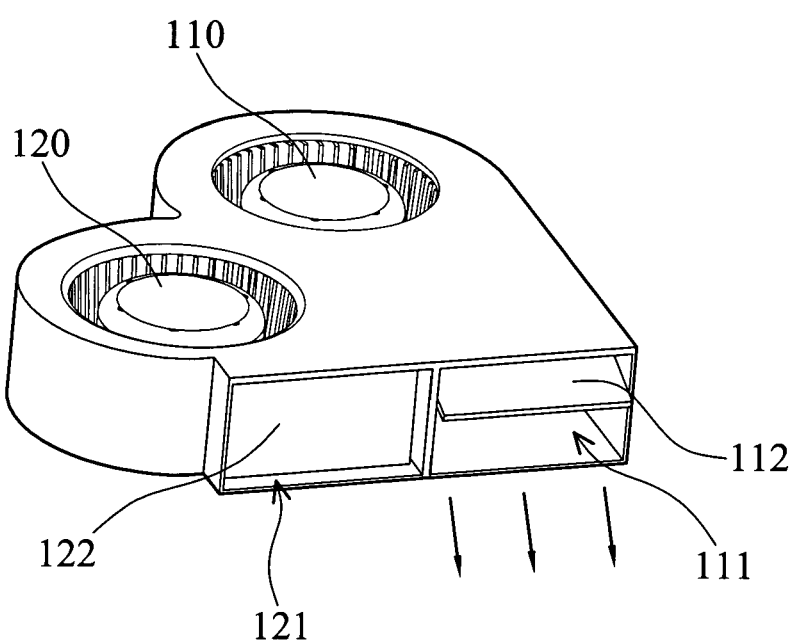
FIG. 1D is a schematic view of the conventional parallel fan module with flappers, in which one of the blowers malfunctions.
Figure 2A:
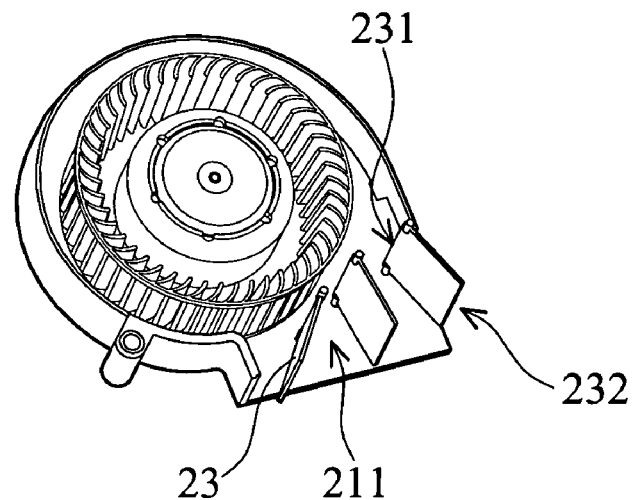
FIG. 2A and FIG. 2B are schematic views of a heat dissipation module of a first embodiment of the invention.
Figure 2B:
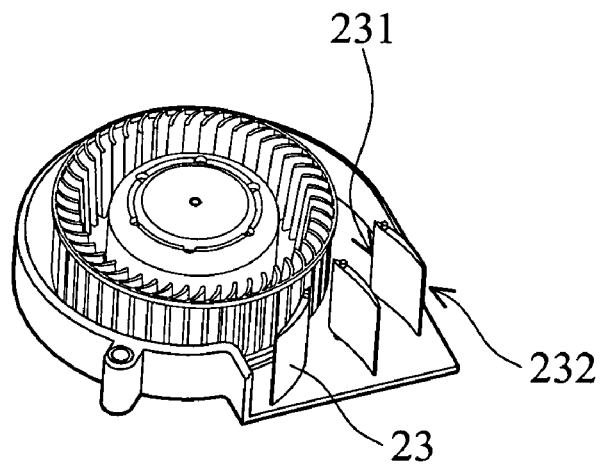

FIG. 2A and FIG. 2B are schematic views of a heat dissipation module of a first embodiment of the invention. In FIG. 2A, the cover of an impeller a heat dissipation apparatus 210 is removed to clearly illustrate the flow direction controlling structure. A flow direction controlling structure is employed in the heat dissipation module 210, also being a heat dissipation apparatus, such as a blower. The flow direction controlling structure includes a plurality of rotatable elements 23, such as flappers, disposed at an outlet 211 of the impeller or heat dissipation apparatus 210. Each of the rotatable elements 23 includes a fixed end 231 and a correspondingly movable end 232 for guiding airflow.

The flow direction controlling structure is modularly formed and detachably attached in one or more positions of the impeller 210. Each of the rotatble elements 23 can be rotatably disposed at the outlet, or disposed in one or more positions of the impeller 210 by axial disposal, coaxial disposal, modular disposal, direct disposal on axis, engagement or other equivalent rotative structures. Each of the rotatable elements 23 is made of polyester films, acrylic resin, glass fiber, or any other filmy material.

Each of the rotatable elements 23 can overlap an adjacent rotatable element 23 so as to selectively seal the impeller.

When several impellers 210 are disposed in a system simultaneously and one of the impellers 210 malfunctions, the rotatable elements 23 seals the outlet 211 of the malfunctioning impeller 210 to prevent backflow. This further reduces heat accumulation.

In the first embodiment, the rotatable elements 23 are sheet-shaped. However, shape of the rotatable elements 23 is not limited thereto. As shown in FIG. 2B, the cross section of the rotatable elements 23 can be wing-shaped, arc-shaped or nonlinear according to the requirements of flow field, and a thickness of each of the rotatable elements 23 varies or decreases from the fixed end 231 to the movable end 232. Thus, the impeller 220 in FIG. 2B has better performance in guiding airflow than the impeller 210 in FIG. 2A, which also leads to reduced noise.

Figure 3A:
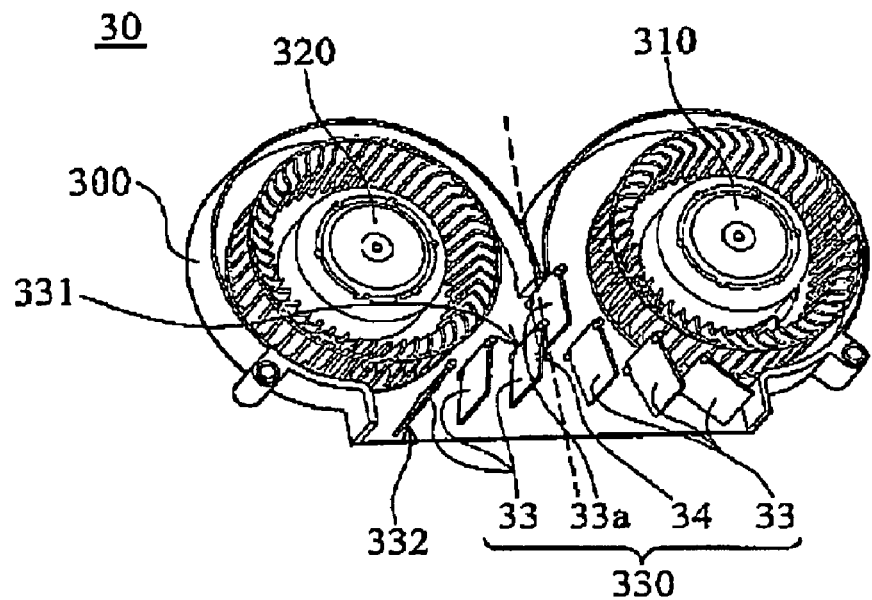
FIG. 3A is a schematic view of a heat dissipation module of a second embodiment of the invention, in which two impeller are in operation.
Figure 3B:
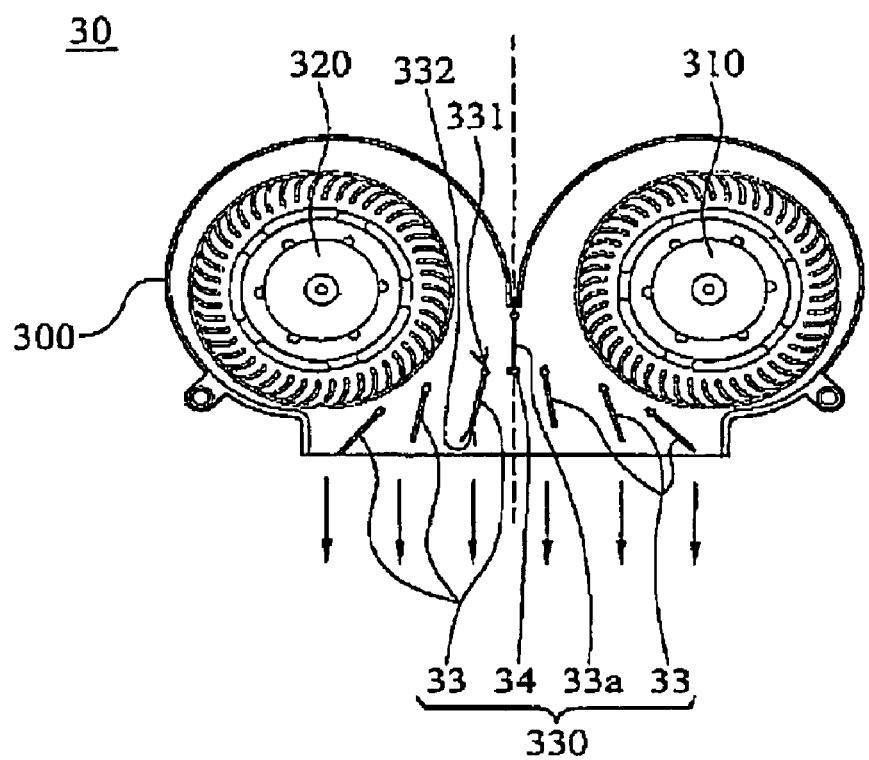
FIG. 3B is a top view of the heat dissipation module in FIG. 3A.

FIG. 3A is a schematic view of a heat dissipation module of a second embodiment of the invention, in which two heat dissipation apparatuses or impellers are in operation. FIG. 3B is a top view of the heat dissipation module in FIG. 3A. The heat dissipation module 30 in the second embodiment is a preferred parallel fan module, which includes a common housing 300, an impeller 310, a second impeller 320, and a flow direction controlling structure 330. The impeller 310 and the second impeller 320 are symmetrically disposed to a virtual line passing several connection points between the first impeller 310 and the second impeller 320. The flow direction controlling structure 330 includes a plurality of rotatable elements 33 disposed between the first impeller 310 and the second impeller 320. The rotatable elements disposed at an outlet corresponding to the first impeller 310 and the rotatable elements disposed at an outlet corresponding to the second impeller 320 can be symmetrical to the virtual line between the first impeller 310 and the second impeller 320. Each of the rotatable elements 33 includes a fixed end 331 and a correspondingly movable end 332 for respectively guiding airflow of the first impeller 310 and the second impeller 320 and reducing turbulence between the two impellers.

Figure 5:
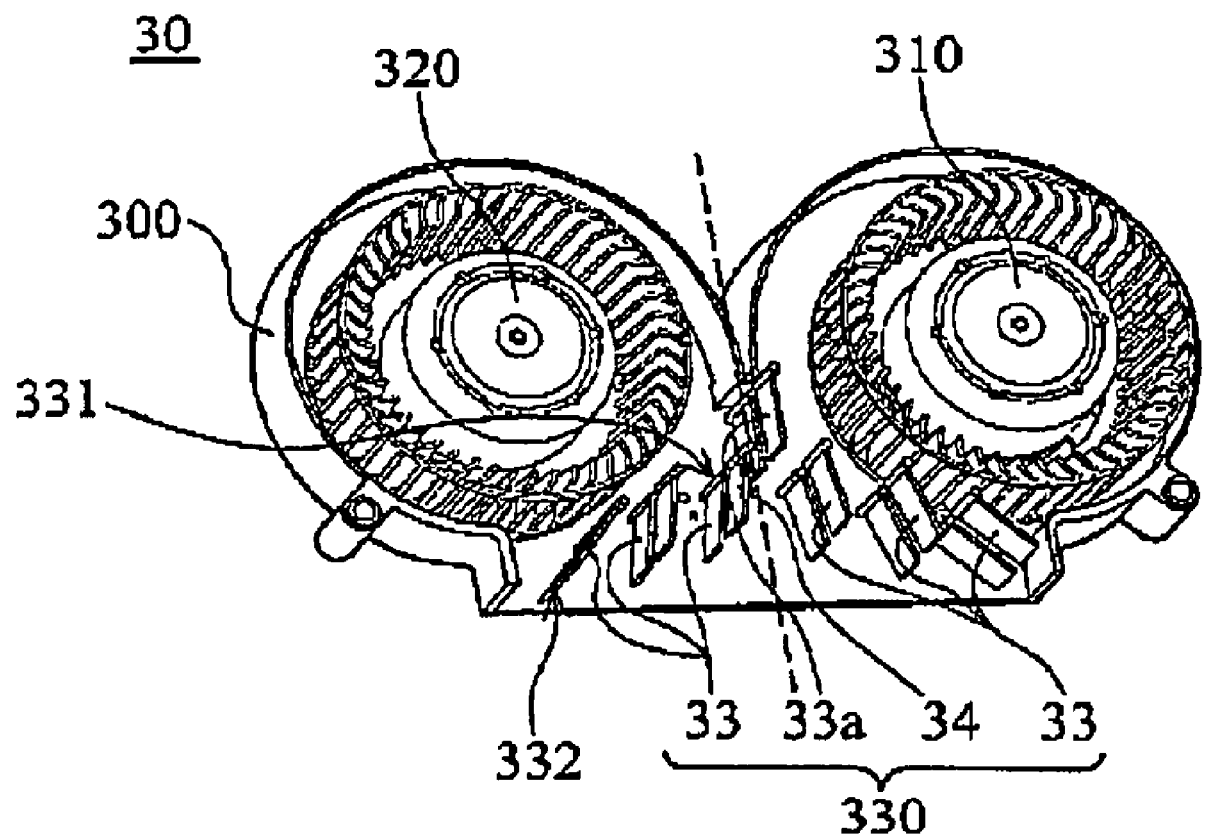
FIG. 5 is a schematic view showing the coaxially disposal of the rotatable element.

The flow direction controlling structure 330 can be modularly formed and detachably attached at the outlets corresponding to the first impeller 310 and the second impeller 320. Each of the rotatable elements 33 can be rotatably disposed between the first impeller 310 and the second impeller 320. Alternatively, each of the rotatable elements 33 is disposed in one or more positions between the first impeller 310 and the second impeller 320 by axial disposal, coaxial disposal (as seen in FIG. 5). modular disposal, direct disposal on axis, engagement or other equivalent rotative structures. The rotatable elements 33 are made of polyester films, acrylic resin, glass fiber, or any other filmy material.

Figure 3C:
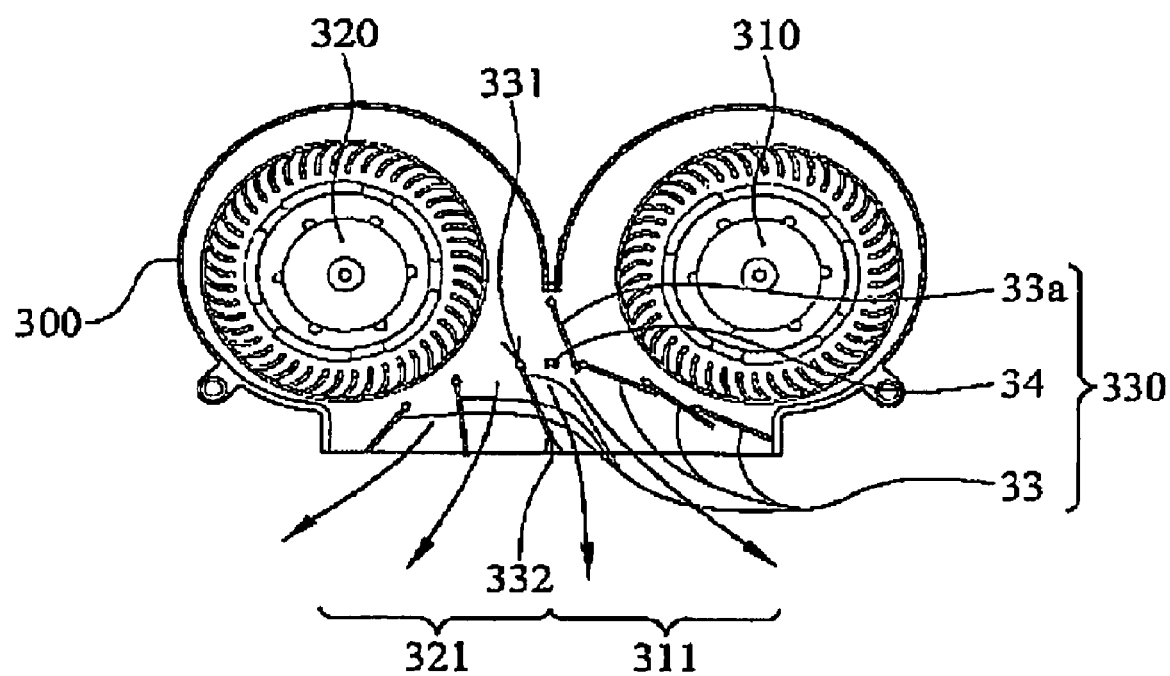
FIG. 3C is a schematic view of the heat dissipation module in FIG. 3A, in which one of the impeller malfunctions.

FIG. 3C is a schematic view of the heat dissipation module in FIG. 3A, in which one of the impeller malfunctions. Referring to FIG. 3B, when the first impeller 310 and the second impeller 320 are in operation, the airflow flows out of the first impeller 310 and the second impeller 320 along the arrows shown in FIG. 3B. One of the rotatable elements, such as rotatable elements 33a, is position at the virtual line and acts as an isolation wall between the first impeller 310 and the second impeller 320.

Further, the flow direction controlling structure 330 has a limiting element 34. When the first impeller 310 and the second impeller 320 are in operation, the limiting element 34 limits the movable end 332 of the rotatable element 33a from deflecting to the first impeller 310 nor the second impeller 320. The limiting element 34 can be a grille, a guiding bar, a linkage passage, an extrusion block, a frame, a blocking body, a shaft, a pin, or other equivalent elements.

Furthermore, when outlet pressure of the first impeller 310 and the second impeller 320 can be different due to different rotation speed or malfunction, the movable ends 332 of the rotatable elements 33 can deflect to the first impeller 310 or the second impeller 320 to change outlet areas of the first impeller 310 and the second impeller 320. As shown in FIG. 3C, when the first impeller 310 malfunctions, the movable ends 332 of the rotatable elements 33 at the outlet of the first impeller 310 are forced by air flow generated by the second impeller 320 and deflect to the first impeller 310 to reduce the outlet area of the first impeller 310. Also, each of the rotatable elements 33 overlaps an adjacent rotatable element 33 so as to seal the first impeller 310.

In addition, when the second impeller 320 malfunctions, the movable ends 332 of the rotatable elements 33 at the outlet of the second impeller 320 are forced by air flow generated by the first impeller 310 and deflect to the second impeller 320 to reduce the outlet area of the second impeller 320. Also, each of the rotatable elements 33 overlaps an adjacent rotatable element 33 so as to seal the second impeller 320.

In FIG. 3C, although the first impeller 310 malfunctions and the second impeller 320 is in operation, the rotatable elements 33 prevent backflow to the first impeller 310, and the overall outlet area of the heat dissipation module 30 maintains substantially the same. That is, the air discharged from the second impeller 320 not only flows through the outlet 321 but also flows through the area where the outlet 311 locates, so that the overall outlet area maintains substantially the same. In this case, air pressure of the beat dissipation module 30 may reduce due to the malfunctioning first impeller 310, but this reduction can be improved by raising the rotation speed of the second impeller 320, so that high heat dissipation effect of the heat dissipation module 30 can be achieved.

Figure 4A:
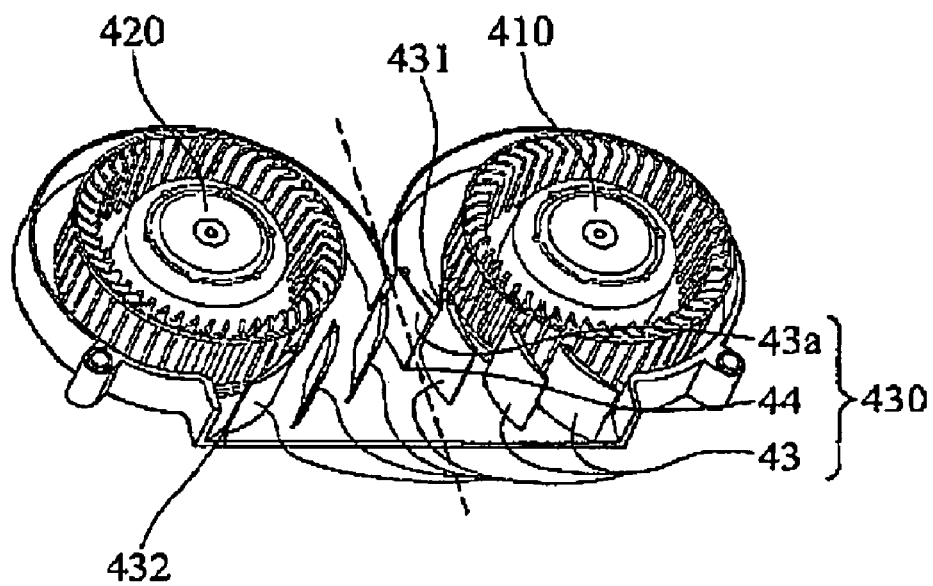
FIG. 4A is a schematic view of a heat dissipation module of a third embodiment of the invention, in which two heat impellers are in operation.
Figure 4B:
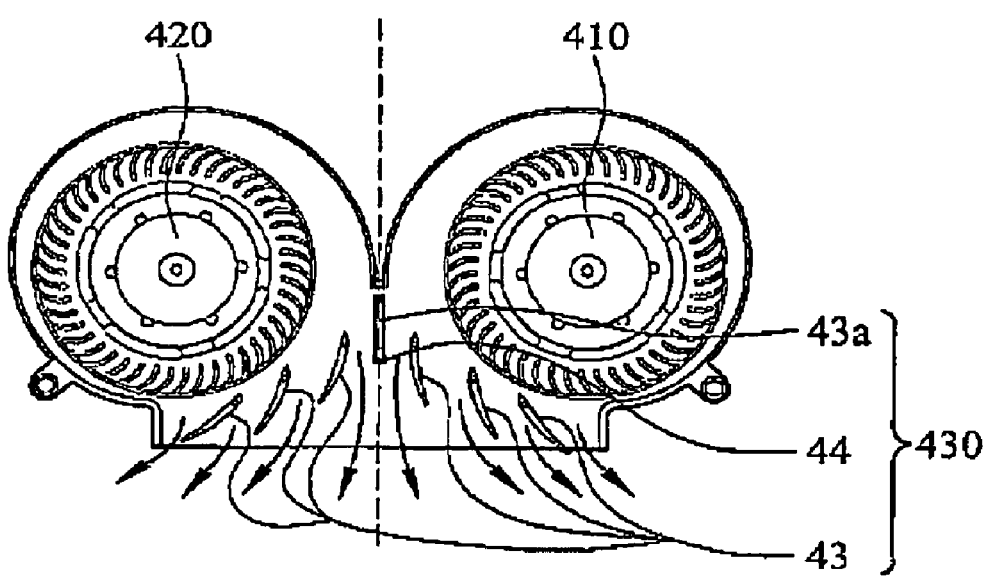
FIG. 4B is a top view of the heat dissipation module in FIG. 4A.

FIG. 4A is a schematic view of a heat dissipation module of a third embodiment of the invention, in which two impeller are in operation. FIG. 4B is a top view of the heat dissipation module in FIG. 4A. The heat dissipation module 40 in the third embodiment, similar to the second embodiment, is a parallel fan module, which includes a first impeller 410, a second impeller 420, and a flow direction controlling structure 430. The first impeller 410 and the second impeller 420 are symmetrically disposed to a virtual line passing connection points between the first impeller 410 and the second impeller 420. The flow direction controlling structure 430 includes a plurality of rotatable elements 43 disposed between the first impeller 410 and the second impeller 420. The rotatable elements disposed at an outlet of the first impeller 410 and the rotatable elements disposed at an outlet of the second impeller 420 can be symmetrical to the virtual line passing several connection points between the first impeller 410 and the second impeller 420. Each of the rotatable elements 43 includes a fixed end 431 and a correspondingly movable end 432 for respectively guiding airflow of the first impeller 410 and the second impeller 420 and reducing turbulence flow between the two impellers.

The flow direction controlling structure 430 can be modularly formed and detachably attached at the outlets of the first impeller 410 and the second impeller 420. Each of the rotatable elements 43 can be rotatably disposed between the first impeller 410 and the second impeller 420, or disposed in one or more positions between the first impeller 410 and the second impeller 420 by axial disposal, coaxial disposal, modular disposal, direct disposal on axis, engagement or other equivalent rotative structures. The rotatable elements 43 are made of polyester films, acrylic resin, glass fiber, or any other filmy material.

Figure 4C:
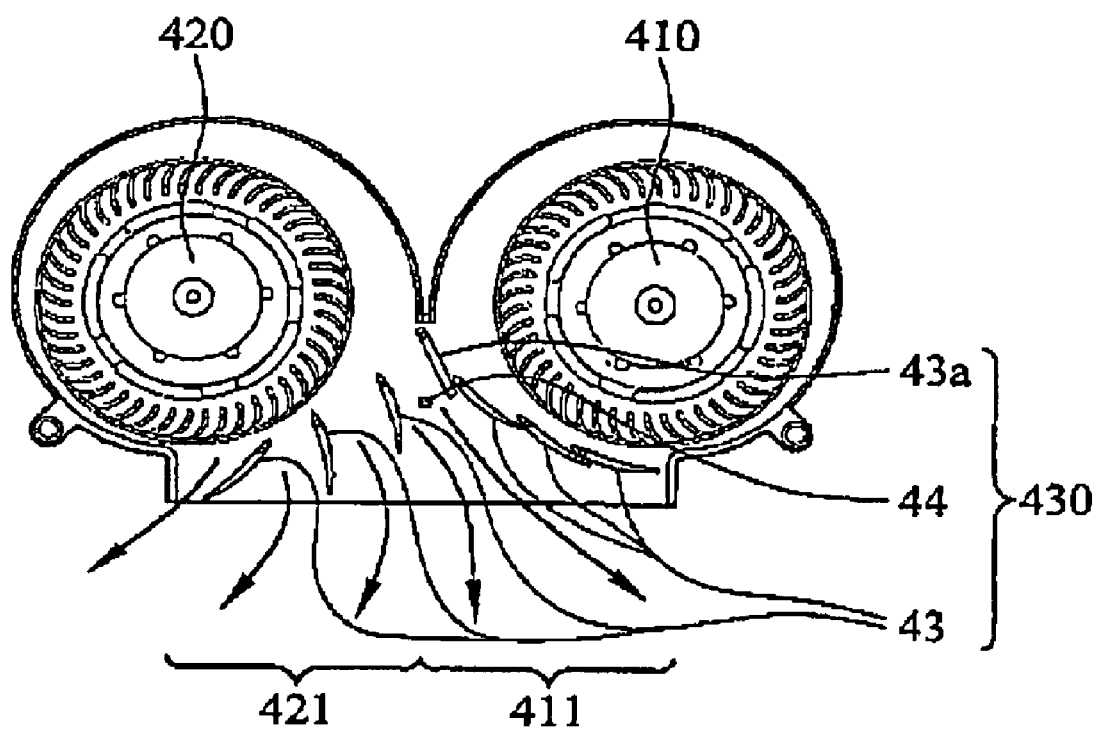
FIG. 4C is a schematic view of the heat dissipation module in FIG. 4A, in which one of the impellers malfunctions.

FIG. 4C is a schematic view of the heat dissipation module in FIG. 4A, in which one of the impellers malfunctions. Referring to FIG. 4B, when the first impeller 410 and the second impeller 420 of the heat dissipation module 40 are in operation, the air flows out of the first impeller 410 and the second impeller 420 along the arrows shown in FIG. 4B. One of the rotatable elements, such as rotatable elements 43a, acts as an isolation wall between the first impeller 410 and the second impeller 420. The fixed end of the rotatable element 43a acting as the isolation wall can be positioned at the virtual line. The rotatable element 43a is preferably sheet-shaped.

Further, the flow direction controlling structure 430 has a limiting element 44. When the first impeller 410 and the second impeller 420 are in operation, the limiting element 44 limits the movable end 432 of the rotatable element 43a from deflecting to the first impeller 410 or the second impeller 420. The limiting element 44 can be a grille, a guiding bar, a linkage passage, an extrusion block, a frame, a blocking body, a shaft, a pin, or other equivalent elements.

The rotatable element 43a acting as the isolation wall is preferably sheet-shaped, but the cross sections of the other rotatable elements 43 can be wing-shaped, arc-shaped or nonlinear shapes, and the thickness of the rotatable elements 43 varies or decreases from the fixed end 431 to the movable end 432. Thus, the rotatable elements 43 guide the airflow and increase heat dissipation area of the heat dissipation module 40, suited to large-scaled heat sources. Further, the wing-shaped, arc-shaped or nonlinear cross sections of the rotatable elements 43 improve flow in the flow field and reduce noise.

Further, when outlet pressure of the first impeller 410 and the second impeller 420 can be different due to different rotation speed or malfunction, the movable ends 432 of the rotatable elements 43 can deflect to the first impeller 410 or the second impeller 420 to change outlet areas of the first impeller 410 and the second impeller 420. As shown in FIG. 4C, when the first impeller 410 malfunctions, the movable ends 432 of the rotatable elements 43 at the outlet of the first impeller 410 are forced by air flow generated by the second impeller 420 and deflect to the first impeller 410 to reduce the outlet area of the first impeller 410. Each of the rotatable elements 43 overlaps an adjacent rotatable element 43 so as to seal the first impeller 410.

In addition, when the second impeller 420 malfunctions, the movable ends 432 of the rotatable elements 43 at the outlet of the second impeller 420 are forced by air flow generated by the first impeller 410 and deflect to the second impeller 420 to reduce the outlet area of the second impeller 420. Also, each of the rotatable elements 43 overlaps the adjacent rotatable element 43 so as to seal the second impeller 420.

In FIG. 4C, although the first heat dissipation apparatus 410 malfunctions and the second heat dissipation apparatus 420 is in operation, the rotatable elements 43 prevent backflow to the first impeller 410, and the overall outlet area of the heat dissipation module 40 maintains substantially the same. That is, the air discharged from the second impeller 420 not only flows through the outlet 411 but also flows through the outlet 421, so that the overall outlet area maintains substantially the same. In this case, air pressure of the heat dissipation module 40 may reduce due to the malfunctioning first impeller 410, but this reduction can be improved by raising the rotation speed of the second impeller 420, so that high heat dissipation effect of the heat dissipation module 40 can be achieved.

To sum up, the invention discloses a heat dissipation module and a flow direction controlling structure, which control airflow and remain overall outlet scope. Instead of the conventional flappers disposed in relation to respective fans, the rotatable elements or the flappers of the present invention have a fixed end and a correspondingly movable end. Also, the rotatable elements of the present invention can be applied to a plurality of fans, which reduces cost in material and manufacture and increases stability of the flow direction controlling structure. Further, the rotatable elements can be sheet-shaped, wing-shaped, arc-shaped or nonlinear to improve the flow field and reduce noise, which improves heat dissipation efficiency of the heat dissipation module. It should be mentioned that the invention is not limited to the above-mentioned embodiments. For example, the impeller can be an axial flow fan or a blower, and the rotatable elements of the flow direction controlling structure can be different shapes.

While the invention has been described by way of example and in terms of the preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A heat dissipation module, comprising:
   a housing;
   at least two impellers disposed in the housing; and
   a flow direction controlling structure, comprising a limiting element and a plurality of rotatable elements disposed at an outlet of the housing;
   wherein each of the rotatable elements comprises a fixed end and a correspondingly movable end, for guiding airflow;
   wherein the impellers comprise a first impeller and a second impeller, and when outlet pressure of corresponding to the first impeller and the second impeller are different, the movable ends of the rotatable elements deflect to the first impeller or the second impeller to change outlet areas of the first impeller and the second impeller, and when the first impeller and the second impeller are in operation, the limiting element limits the movable ends of the rotatable elements from deflecting to the first impeller or the second impeller.

2. The heat dissipation module as claimed in claim 1, wherein a cross section of each of the rotatable elements is sheet-shaped, wing-shaped, arc-shaped or nonlinear.

3. The heat dissipation module as claimed in claim 1, wherein each of the rotatable elements overlaps an adjacent rotatable element so as to selectively seal the impellers.

4. heat dissipation module as claimed in claim 1, wherein when the first impeller malfunctions, the movable ends of the rotatable elements are forced by air flow generated by the second impeller and deflect to the first impeller to prevent backflow from entering the first impeller.

5. The heat dissipation module as claimed in claim 1, wherein one of the rotatable elements acts as an isolation wall between the first impeller and the second impeller, so that the first impeller and the second impeller respectively connect to a individual tunnel.

6. The heat dissipation module as claimed in claim 1, wherein the flow direction controlling structure is modularly and rotatably disposed and detachably attached in one or more positions between the first impeller and the second impeller.

7. The heat dissipation module as claimed in claim 1, wherein the heat dissipation module is a parallel fan.

8. The heat dissipation module as claimed in claim 1, wherein a thickness of each of the rotatable elements varies from the fixed end to the movable end, or the thickness of each of the rotatable elements decreases from the fixed end to the movable end.

* * * * *